US012635172B2

(12) United States Patent
Zhang et al.

(10) Patent No.: US 12,635,172 B2
(45) Date of Patent: May 19, 2026

(54) SEMICONDUCTOR DEVICES INCLUDING A PLURALITY OF FINS WITH CORRESPONDING GATE OXIDE LAYERS, FABRICATION METHODS THEREOF, 3D MEMORIES AND MEMORY DEVICES

(71) Applicant: Yangtze Memory Technologies Co., Ltd., Wuhan (CN)

(72) Inventors: Quan Zhang, Wuhan (CN); Lan Yao, Wuhan (CN); Boru Xie, Wuhan (CN); Jie Yan, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 412 days.

(21) Appl. No.: 18/323,957

(22) Filed: May 25, 2023

(65) Prior Publication Data

US 2024/0292625 A1 Aug. 29, 2024

(30) Foreign Application Priority Data

Feb. 24, 2023 (CN) ......................... 202310180424.X

(51) Int. Cl.
*H10D 30/62* (2025.01)
*H10B 41/20* (2023.01)
(Continued)

(52) U.S. Cl.
CPC ......... *H10D 30/6211* (2025.01); *H10B 41/20* (2023.02); *H10B 41/35* (2023.02);
(Continued)

(58) Field of Classification Search
CPC ........ H10B 41/20; H10B 41/35; H10B 43/20; H10B 43/35; H10D 30/01; H10D 30/019–0198; H10D 30/024; H10D 30/501–509; H10D 30/6211; H10D 62/235; H10D 64/512; H10D 64/514; H10D 84/01; H10D 84/0144; H10D 84/0151; H10D 84/0158; H10D 84/032; H10D 84/035; H10D 84/038; H10D 84/05; H10D 84/07; H10D 84/08; H10D 84/8311; H10D 84/8312; H10D 84/83125; H10D 84/83138; H10D 84/8314; H10D 84/8316; H10D 84/832–833; H10D 84/834; H10D 84/835; H10D 84/836; H10D 84/837–839
See application file for complete search history.

(56) References Cited

U.S. PATENT DOCUMENTS

| | | | |
|---|---|---|---|
| 10,038,079 B1* | 7/2018 | Ohtou .................. | H10D 84/038 |
| 2016/0104705 A1* | 4/2016 | Chung .............. | H10D 84/0158 |
| | | | 257/401 |

* cited by examiner

*Primary Examiner* — Cheung Lee
(74) *Attorney, Agent, or Firm* — Hanley, Flight & Zimmerman, LLC

(57) ABSTRACT

Examples of the present application provide a semiconductor device, a fabrication method thereof, a 3D memory and a memory device, wherein the semiconductor device includes: a substrate including first fins and second fins; a first gate oxide layer disposed on the first fins; a second gate oxide layer disposed on the second fins, wherein the sum of the thicknesses of the first fin and the first gate oxide layer is less than or equal to the sum of the thicknesses of the second fin and the second gate oxide layer; and a gate layer disposed on the first gate oxide layer and the second gate oxide layer. In the way described above, difficulty of etching process is reduced and yield and performance of products are improved.

20 Claims, 8 Drawing Sheets

(51) Int. Cl.

| | |
|---|---|
| *H10B 41/35* | (2023.01) |
| *H10B 43/20* | (2023.01) |
| *H10B 43/35* | (2023.01) |
| *H10D 30/01* | (2025.01) |
| *H10D 84/01* | (2025.01) |
| *H10D 84/03* | (2025.01) |
| *H10D 84/83* | (2025.01) |

(52) U.S. Cl.
CPC ............. *H10B 43/20* (2023.02); *H10B 43/35* (2023.02); *H10D 30/024* (2025.01); *H10D 84/0151* (2025.01); *H10D 84/0158* (2025.01); *H10D 84/038* (2025.01); *H10D 84/834* (2025.01)

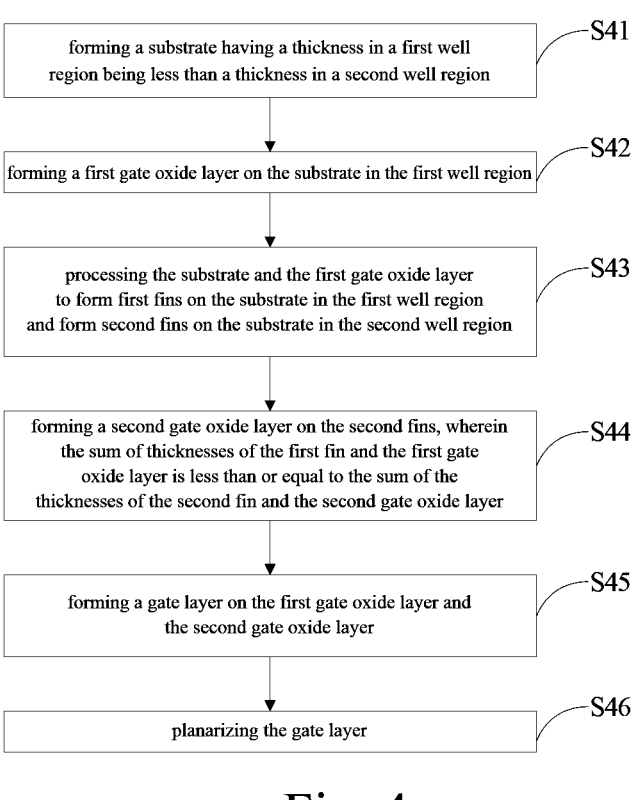

| | |
|---|---|
| forming a substrate having a thickness in a first well region being less than a thickness in a second well region | S41 |
| forming a first gate oxide layer on the substrate in the first well region | S42 |
| processing the substrate and the first gate oxide layer to form first fins on the substrate in the first well region and form second fins on the substrate in the second well region | S43 |
| forming a second gate oxide layer on the second fins, wherein the sum of thicknesses of the first fin and the first gate oxide layer is less than or equal to the sum of the thicknesses of the second fin and the second gate oxide layer | S44 |
| forming a gate layer on the first gate oxide layer and the second gate oxide layer | S45 |
| planarizing the gate layer | S46 |

Fig. 4

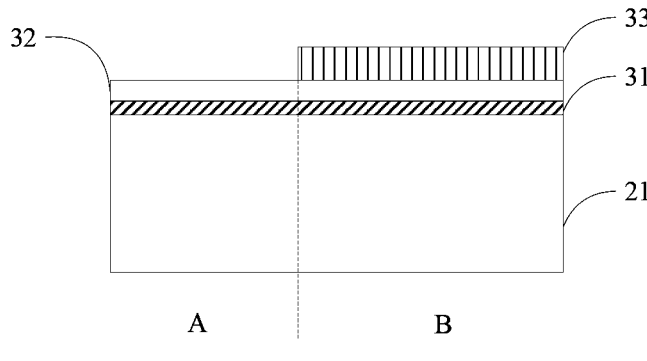

Fig. 5

SEMICONDUCTOR DEVICES INCLUDING A PLURALITY OF FINS WITH CORRESPONDING GATE OXIDE LAYERS, FABRICATION METHODS THEREOF, 3D MEMORIES AND MEMORY DEVICES

CROSS-REFERENCE TO RELATED APPLICATION

This application claims priority to and the benefit of Chinese Patent Application 202310180424.X, filed on Feb. 24, 2023, which is hereby incorporated by reference in its entirety.

TECHNICAL FIELD

The present application relates to the field of memory technologies, and more particularly to semiconductor devices, fabrication methods thereof, 3D memories and memory devices.

BACKGROUND

As feature sizes of memory cells approach a lower process limit, planar process and fabrication techniques become challenging and costly. As a result, the memory density for 2D or planar NAND flash memory approaches an upper limit. In order to break the limitations suffered by the 2D or planar NAND flash memory, a memory having three-dimensional structures (3D NAND) has been developed in the industry to increase the memory density by disposing memory cells three-dimensionally over a substrate.

In a 3D memory, a planar type transistor (e.g. metal oxide semiconductor field effect transistor, MOSFET) and a fin field-effect transistor (Fin-FET) are usually integrated on the same chip.

BRIEF DESCRIPTION OF ACCOMPANYING DRAWINGS

In order to explain the technical solutions in the examples of the present application more clearly, accompanying drawings required for describing the examples will be described briefly hereafter. It is obvious that the drawings described below are only some examples of the present application and other drawings can be obtained according to those drawings without any creative works.

FIG. 4 is a flow chart illustrating an example of a method of fabricating a semiconductor device provided by the present application;

FIG. 5 is a first structural diagram illustrating the fabrication process in S41 of FIG. 4;

DETAILED DESCRIPTION

Figure 1:
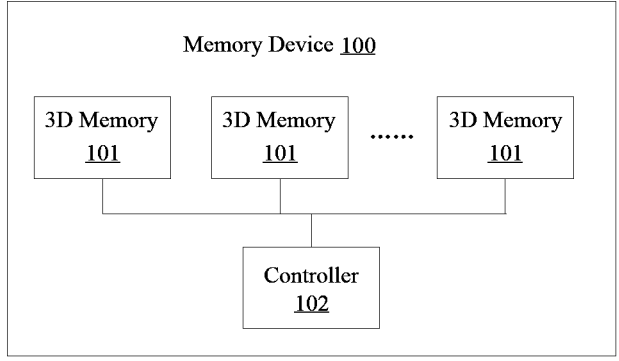
FIG. 1 is a structural diagram of an example memory device provided by the present application.

The technical solutions in examples of the present application will be described below clearly and completely with reference to accompanying drawings for the examples of the present application. It is obvious that the examples to be described are only some, not all, examples of the present application. All other examples obtained by those skilled in the art based on the examples of the present application without any creative works fall within the scope claimed by the present application.

In the description of the present application, it is understood that orientation and position relationships indicated by terms "center", "longitudinal", "traverse", "length", "width", "thickness", "upper", "lower", "front", "back", "left", "right", "vertical", "horizontal", "top", "bottom", "inner", "outer" and the like are those shown based on the drawings and only for the purpose of facilitating and simplifying the description of the present application, instead of indicating or implying that the devices or elements as referred to must have any particular orientations and positions, or be constructed or operated in any particular orientations and positions, thus should not be understood as any limitation on the present application. Moreover, the terms "first", "second" etc. are only used for the purpose of description and should not be understood to indicate or imply relative importance or to designate the number of the referenced technical features implicitly. Therefore, a feature defined as "first" or "second" may include explicitly or implicitly one or more instances of the feature. In the description of the present application, "a plurality of" means two or more than two unless otherwise defined explicitly.

The phrase "A and/or B" includes three combinations: only A, only B and a combination of A and B.

The expression "suitable for" or "configured to" as used herein has an open and inclusive meaning and is not intended to exclude that a device is suitable for additional tasks or steps or configured to perform additional tasks or steps. In addition, the phrase "based on" has an open and inclusive meaning, because a process, a step, a calculation or other action "based on" one or more conditions or values can also be based on additional conditions or exceed the values in practice.

Any examples being described in the present application should not necessarily be explained to be preferred or advantageous over other examples. The following description is provided to enable those of ordinary skill in the art to implement and use the present application. In the following description, details are given for the purpose of explanation. It is understood that those having ordinary skill in the art can appreciate that the present application can be practiced without these specific details. In other instances, well-known structures and processes will not be described in detail to avoid obscuring the description of the present application with unnecessary details. Therefore, it is not intended to limit the present application to the illustrated examples. Instead, the present application is consistent with the broadest scope according to the principle and features disclosed herein.

FIG. 1 is a structural diagram of an example of a memory device provided by the present application. The memory device 100 includes at least one 3D memory 101 and a controller 102. The controller 102 is coupled to the 3D memory 101 to control the data stored therein. The memory device 100 can be integrated into various memory cards such as a personal computer (PC) card (PCMCIA, personal computer memory card international association), a compact flash (CF) card, a smart media (SM) card, a memory stick, a multimedia card (MMC), a secure digital memory card (SD), a universal flash storage (UFS), a solid state drive (SSD) and the like.

The controller 102 is configured to operate in a low duty-cycle environment like an SD card, a CF card, a universal serial bus (USB) flash drive or any other medium for use in an electronic device, such as a personal computer, a digital camera, a mobile phone, etc.

Alternatively, the controller 102 is configured to operate in a high duty-cycle environment like an SSD or an eMMC, used as a data storage for a mobile device such as a smart phone, a tablet computer or a laptop computer, and an enterprise storage array.

Or, the controller 102 is configured to manage the data stored in each 3D memory 101 and communicates with an external device (e.g., a host) according to a particular communication protocol. The communication protocol includes at least one of a USB protocol, an MMC protocol, a peripheral component interconnection (PCI) protocol, a peripheral component interconnect express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol and a Firewire protocol.

The controller 102 can be configured to control operations of the 3D memory 101, such as read, erase, and program operations. In some examples, the controller 102 can also be configured to manage various functions with respect to the data stored or to be stored in the 3D memory 101, including at least one of bad-block management, garbage collection, logical-to-physical address conversion and wear leveling. In some examples, the controller 102 is further configured to process error correction codes with respect to the data read from or written to the 3D memory 101. Any other suitable function can be performed by the controller 102 as well, for example, formatting the 3D memory 101.

Figure 2:
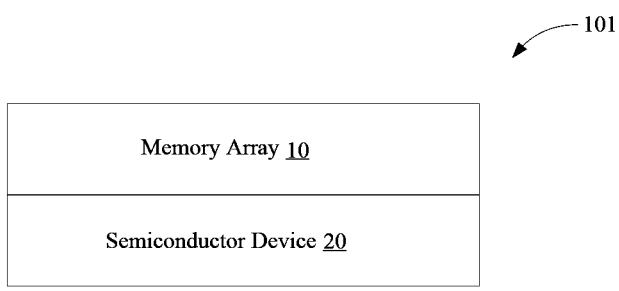
FIG. 2 is structural diagram of a 3D memory provided by an example of the present application.

FIG. 2 is structural diagram of the 3D memory provided by an example of the present application. The 3D memory 101 includes a memory array 10 and a semiconductor device 20 serving as peripheral circuits (peripheral devices) for the memory array 10. Specifically, the memory array 10 and the semiconductor device 20 may be two separate chips that are electrically connected through bonding to form the 3D memory 101.

The semiconductor device 20 includes semiconductor structures. The peripheral devices 10 may include peripheral circuits such as a page buffer, decoders (e.g. a row decoder and a column decoder), a sense amplifier, a driver (e.g. a wordline driver), a charge pump and a current/voltage reference. At least one of the peripheral circuits includes a semiconductor structure and transistors disposed on the semiconductor structure. The peripheral circuits may have a periphery near cell (PNC) architecture, a periphery under cell (PUC) architecture or an inverted X-tacking architecture, and examples of the present application is not limited with respect to this.

Figure 3:
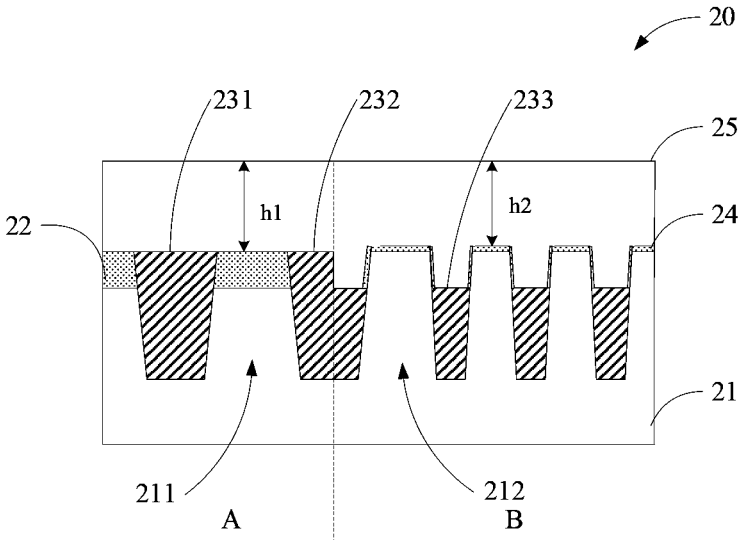
FIG. 3 is a structural diagram of an example of a semiconductor device provided by the present application.

FIG. 3 is a structural diagram of an example of the semiconductor device provided by the present application. The semiconductor device 20 includes a substrate 21, a first gate oxide layer 22, a second gate oxide layer 24 and a gate layer 25.

The substrate 21 refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

The first gate oxide layer 22 and the second gate oxide layer 24 refer to materials serving as dielectric layers in the semiconductor device 20. Optionally, they generally use silicon oxide, silicon oxynitride, chromium oxide, etc.

The gate layer 25 refers to the gates of planar transistors or field effect transistors in the semiconductor device 20. Optionally, the gate layer 25 may be a material layer formed by doping of polysilicon.

In the present example, the semiconductor device 20 includes a first well region A and a second well region B. In one example, the first well region A is a high voltage (HV) well region and the second well region B is a low voltage well region. Further, the low voltage well region may further include a first low voltage well region and a second low voltage well region. For example, the first low voltage well region is a Low Voltage (LV) well region and the second low voltage well region is a Low Low Voltage (LLV) well region. Optionally, in one example, the first well region A (the high voltage well region HV) can be understood as a well region, in which semiconductor devices are formed to have a turn-on or threshold voltage larger than 5V; and the second well region B (the low voltage well region LV and the low low voltage well region LLV) can be understood as a well region, in which semiconductor devices are formed to have a turn-on or threshold voltage smaller than or equal to 5V, wherein the low low voltage well region LLV can be understood as a well region, in which semiconductor devices are formed to have a turn-on or threshold voltage smaller than or equal to 1.6V. In a further example, the semiconductor devices formed in the first well region A are planar transistors, while the semiconductor devices formed in the second well region B are fin-FETs.

The substrate 21 includes at least one first fin 211 in the first well region A and includes at least one second fin 212 in the second well region B. The term "fin" is defined to be a protruding portion of the substrate 21 and belongs to the substrate 21, which can be formed by patterning (e.g. etching) of the substrate. The first gate oxide layer 22 is disposed on the first fin 211, the second gate oxide layer 24 is disposed over the second fin 212 and the gate layer 25 is disposed on the first gate oxide layer 22 and the second gate oxide layer 24. Optionally, the gate layer 25 may also be further patterned to form a first gate layer corresponding to the first gate oxide layer 22 and a second gate layer corresponding to the second gate oxide layer 24, which will not be detailed here.

In the present example, the sum of the thicknesses of the first fin 211 and the first gate oxide layer 22 is smaller than or equal to that of the second fin 212 and the second gate oxide layer 24. It is to be noted that the thickness of the first fin 211 is defined to be the vertical height from the bottom surface of the substrate 21 to the top surface of the first fin 211 and the thickness of the second fin 212 is defined to be the vertical height from the bottom surface of the substrate 21 to the top surface of the second fin 212.

It can be understood that, in related technologies, in order to reduce the area of the region with transistors, the X-FET process is used, in which a planar memory device is made to a 3D memory device. In the X-FET process, the region with recesses formed during the formation of shallow trench isolations (STIs) can be filled up with the planarization of polysilicon. However, there is a gap between the polysilicon of HV well region and the polysilicon of the LV/LLV well region, i.e. there is a difference between the height of the gate oxide layer of the HV well region and the height of the gate oxide layer of the LV/LLV well region, or to state in another way, the height of the gate oxide layer of the HV well region is higher than the height of the gate oxide layer of the LV/LLV well region, which makes the thickness of the gate layer (polysilicon) of the HV well region smaller than the thickness of the gate layer of the LV/LLV well region. Therefore, the smaller thickness of the gate layer in the HV well region brings more challenges for the etching of the gate layer.

In the present example, since the sum of the thicknesses of the first fin 211 and the first gate oxide layer 22 is smaller than or equal to that of the second fin 212 and the second gate oxide layer 24, i.e. the height of the first gate oxide layer 22 is the same as or lower than that of the second gate oxide layer 24, after formation of the gate layer 25 on the first gate oxide layer 22 and the second gate oxide layer 24 and planarization of the gate layer 25, the thickness of the gate layer 25 corresponding to the first well region A is larger than or equal to that of the gate layer 25 corresponding to the second well region B. Since during an etching process the smaller the thickness is, the stricter requirements will be imposed on the etching process, in the present example, when patterning (etching) the gates, the etching process window for etching the gates is enlarged since the thickness of the gate layer is increased, thus lowering the degree of process difficulty.

In a specific example, the thickness of the first fin 211 is smaller than that of the second fin 212, the thickness of the first gate oxide layer 22 is larger than that of the second gate oxide layer 24, and the sum of the thicknesses of the first fin 211 and the first gate oxide layer 22 is smaller than or equal to that of the second fin 212 and the second gate oxide layer 24.

Optionally, in one example, the semiconductor device 20 further includes first isolation structures 231, second isolation structures 232 and a third isolation structure 233. The first isolation structure 231 is disposed between two adjacent first fins 211, the second isolation structure 232 is disposed between two adjacent second fins 212 and the third isolation structure 233 is disposed between one first fin 211 and one second fin 212 adjacent to the one first fin 211. It can be understood that during subsequent fabrication processes, a plurality of planar transistors and a plurality of fin-FETs are formed on the substrate 21 to fabricate peripheral circuits. The first isolation structures 231 are used to isolate active areas (AAs) in the substrate 21 in the first well region A from each other and the second isolation structures 232 are used to isolate active areas in the substrate 21 in the second well region B from each other, and the third isolation structure 233 is used to isolate the first well region A from the second well region B.

In a further example, the sum of thicknesses of the first fin 211 and the first gate oxide layer 22 is equal to the thickness of the first isolation structure 231. It can be understood that, since the sum of thicknesses of the first fin 211 and the first gate oxide layer 22 is equal to the thickness of the first isolation structure 231, such that the thickness of the gate layer 25 in the first well region A is the same as that of the gate layer 25 in the second well region B, so that, compared with the traditional process in which a gate layer 25 in the first well region A has a smaller thickness, the etching process window for etching the gates in the first well region A is enlarged, lowering the degree of process difficulty.

In a further example, the sum of the thicknesses of the first fin 211 and the first gate oxide layer 22 is smaller than the thickness of the first isolation structure 231. It can be understood that, since the sum of thicknesses of the first fin 211 and the first gate oxide layer 22 is smaller than the thickness of the first isolation structure 231, such that the thickness of the gate layer 25 in the first well region A is larger than that of the gate layer 25 in the second well region B, so that, compared with the traditional process in which a gate layer 25 in the first well region A has a smaller thickness, the etching process window for etching the gates in the first well region A is enlarged, lowering the degree of process difficulty.

In a further example, the thickness of the second isolation structure 232 is smaller than that of the second fin 212. The second gate oxide layer 24 is disposed on the side surface and top surface of the portion of the second fin 212 protruding above the second isolation structure 232 and is connected with the second isolation structure 232. It can be understood that, since a fin-type transistor will be formed in the second well region B, so that a shallow trench isolation (STI) is formed on the second isolation structure 232 and filled up with polysilicon. Therefore, in the present example, the second gate oxide layer 24 is connected with the second isolation structure 232 to achieve the isolation (insulation) between the polysilicon (the gate layer 25) and the second fins 212.

In a further example, the third isolation structure 233 is located on the boundary between the first well region A and the second well region B and has a thickness in a portion of the first well region A equal to the thickness of the first isolation structure 231 and has a thickness in a portion of the second well region B equal to the thickness of the second isolation structure 232. It can be understood that an isolation structure is generally to isolate semiconductor devices, for example, two transistors from each other, but the third isolation structure 233 also serves to isolate the first well region A from the second well region B, so that a portion of the third isolation structure 233 serves as the first well region A and a portion of the third isolation structure 233 is located in the second well region B, such that the third isolation structure 233 has a thickness in a portion of the first well region A equal to the thickness of the first isolation structure 231 and has a thickness in a portion of the second well region B equal to the thickness of the second isolation structure 232, such that the third isolation structure 233 has the same function as the first isolation structure 231 in the first well region A and has the same function as the second isolation structure 232 in the second well region B.

Based on the example of FIG. 3 described above, a process flow for fabrication of the semiconductor device 20 described above will be presented in the following. As shown in FIG. 4, which is a flow chart illustrating an example of a method of fabricating a semiconductor device provided by the present application, the semiconductor device including a first well region A and a second well region B, the method includes the following: S41: forming a substrate to have a thickness in the first well region being less than a thickness in the second well region.

Optionally, S41 may specifically include the following operations:

As shown in FIG. 5, providing a substrate 21, forming a first sacrificial layer 31 on the substrate 21 in both the first well region A and the second well region B, forming a second sacrificial layer 32 on the first sacrificial layer 31 in both the first well region A and the second well region B, and forming a third sacrificial layer 33 on the second sacrificial layer 32 in the second well region B.

The substrate 21 is not limited in material. By illustration, the material for forming the substrate 21 may be a semiconductor material, such as silicon (single crystal silicon, polysilicon, or amorphous silicon), germanium (single crystal germanium), silicon germanium, silicon carbide, glass, gallium nitride, gallium Arsenide, glass, SOI (silicon on insulator), GOI (germanium on insulator) or any other suitable III-V compound. The substrate 21 may also be P-doped or N-doped.

The first sacrificial layer 31 and the second sacrificial layer 32 may be silicon nitride, silicon oxide or the like and the third sacrificial layer 33 may be photoresist. Specifically, a layer of photoresist may be formed on the second sacrificial layer 32 and patterned using a light shield (mask) with a particular pattern to obtain the third sacrificial layer 33 corresponding to the second well region B.

Figure 6:
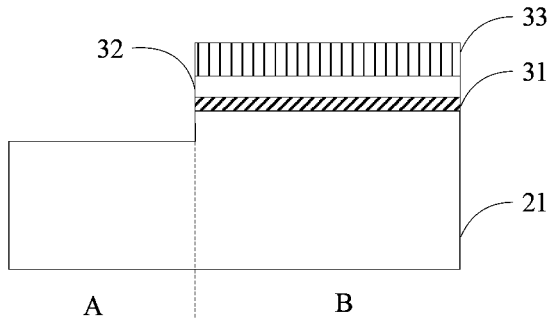
FIG. 6 is a second structural diagram illustrating the fabrication process in S41 of FIG. 4.

Further, as shown in FIG. 6, the first well region A is thinned to remove the first sacrificial layer 31 and the second sacrificial layer 32 in the first well region A and further to make the thickness of the substrate 21 in the first well region A less than the thickness of the substrate 21 in the second well region B.

Etching can be used to thin the first well region A. Since photoresist (the third sacrificial layer 33, also known as a mask layer) is on the second well region B, only first well region A can be thinned during the etching process.

The remaining sacrificial layers can be removed by etching using chemical gases. Compared with plasma etching, the etching using chemical gases needs no plasma, so that the problem of gathering of charged particles in the substrate 21 can be avoided and thus plasma induced damages (PIDs) can be reduced, leading to an increased yield.

Figure 7:
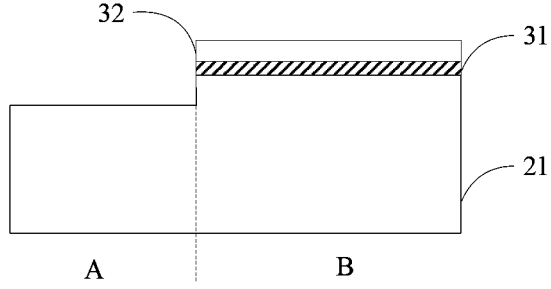
FIG. 7 is a third structural diagram illustrating the fabrication process in S41 of FIG. 4.

Further, as shown in FIG. 7, the photoresist (the third sacrificial layer 33) in the second well region B is removed specifically using an asher. The third sacrificial layer 33 can also be burned off using oxygen.

Optionally, the surface of the substrate 21 in the first well region A can also be reconditioned and pre-cleaned before the formation of the first gate oxide layer in S42.

S42: forming a first gate oxide layer on the substrate in the first well region.

Figure 8:
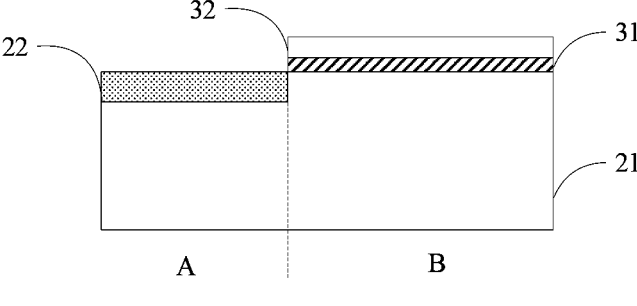
FIG. 8 is a structural diagram illustrating the fabrication process in S42 of FIG. 4.

As shown in FIG. 8, the first gate oxide layer 22 is formed using a method, in which a layer of oxide material can be grown with a mask on the substrate 21 in the high voltage well region A to form the first gate oxide layer 22. The growing process may be done by deposition by technologies such as, for example, chemical vapor deposition (CVD), physical vapor deposition (PVD), plasma enhanced chemical vapor deposition (PECVD) or the like.

The material of the first gate oxide layer 22 may include, but not limited to, silicon oxide. The first gate oxide layer 22 is provided to form a gate layer thereon subsequently. The gate layer may serve as gates of planar transistors in the semiconductor structure 20.

S43: performing processes to the substrate and the first gate oxide layer to form at least one first fin on the substrate in the first well region and form at least one second fin on the substrate in the second well region.

Figure 9:
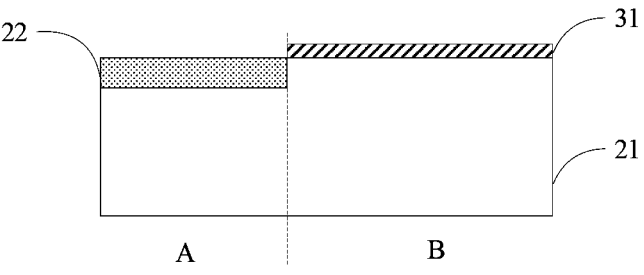
FIG. 9 is a first structural diagram illustrating the fabrication process in S43 of FIG. 4.

Optionally, the S43 may specifically include the following operations: As shown in FIG. 9, the second sacrificial layer 32 is removed.

Figure 10:
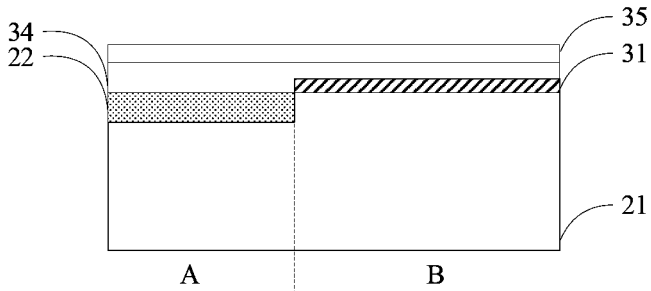
FIG. 10 is a second structural diagram illustrating the fabrication process in S43 of FIG. 4.

As shown in FIG. 10, a fourth sacrificial layer 34 is formed on the first gate oxide layer 22 in the first well region A and on the first sacrificial layer 31 in the second well region B. and a fifth sacrificial layer 35 is formed on the fourth sacrificial layer 34 in both the first well region A and the second well region B.

Optionally, the material of the fourth sacrificial layer 34 may be silicon nitride and the material of the fifth sacrificial layer 35 may be silicon oxynitride.

Figure 11:
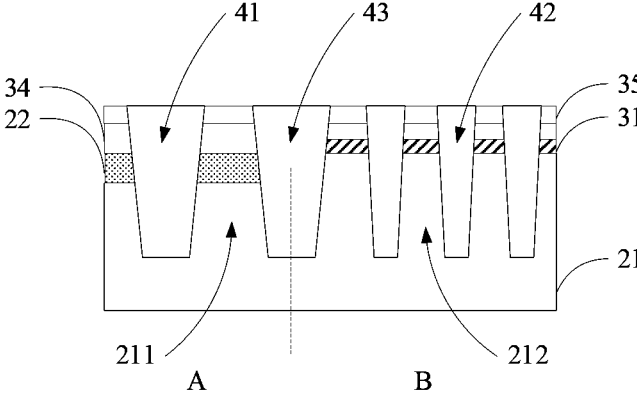
FIG. 11 is a third structural diagram illustrating the fabrication process in S43 of FIG. 4.

As shown in FIG. 11, first trenches 41 are formed in the substrate 21 in the first well region A, second trenches 42 are formed in the substrate 21 in the second well region B and a third trench 43 is formed on the substrate 21 at the boundary between the first well region A and the second well region B, so that first fins 211 and second fins 212 are formed on the substrate 21.

Optionally, the trenches can be formed with an etching process.

The first trenches 41, the second trenches 42 and the third trench 43 have the same depth. That is to say, the bottom surfaces of the first trenches 41, the second trenches 42 and the third trench 43 have the same vertical distance from the surface of the fifth sacrificial layer 35 or have the same vertical distance from the bottom surface of the substrate 21. Further, since the first well region A has been thinned as shown in FIG. 6, the thickness of the substrate 21 in the first well region A is less than the thickness of the substrate 21 in the second well region B, so that the first fins 211 are formed to have a thickness less than that of the second fins 212.

Figure 12:
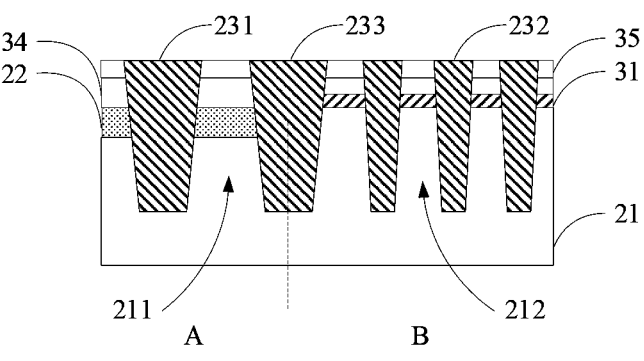
FIG. 12 is a fourth structural diagram illustrating the fabrication process in S43 of FIG. 4.

As shown in FIG. 12 in combination with FIG. 11, first isolation structures 231 are formed in the first trenches 41, second isolation structures 232 are formed in the second trenches 42 and a third isolation structure 233 is formed in the third trench 43.

Optionally, the material of the above-mentioned isolation structures may be silicon nitride.

It can be understood that first isolation structure 231 described above penetrates through the fifth sacrificial layer 35, the fourth sacrificial layer 34 and the first gate oxide layer 22 sequentially and partially into the substrate 21 in the first well region A, while second isolation structure 232 penetrates through the fifth sacrificial layer 35, the fourth sacrificial layer 34 and the first sacrificial layer 31 sequentially and partially into the substrate 21 in the second well region B.

Optionally, the resulting semiconductor structure may also be planarized after the formation of the above-mentioned isolation structures. For example, the chemical mechanical polishing (CMP) process can be used.

Figure 13:
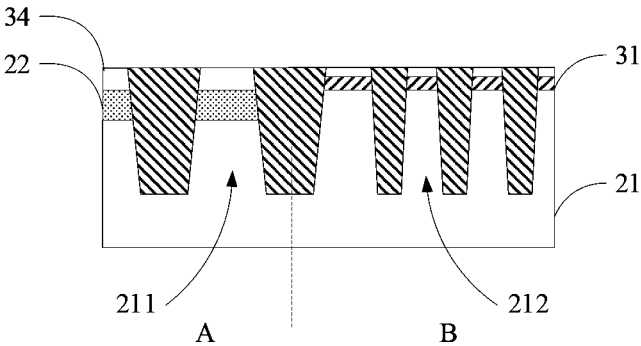
FIG. 13 is a fifth structural diagram illustrating the fabrication process in S43 of FIG. 4.

Optionally, before S44, the following operations can be included:

As shown in FIG. 13, the first well region A and the second well region B are thinned to expose the fourth sacrificial layer 34.

Then, the first well region A and the second well region B can be thinned using dry etching to remove the fifth sacrificial layer 34 (silicon oxynitride). The etching gases for the dry etching may include carbon-based or fluorine-based gases.

Figure 14:
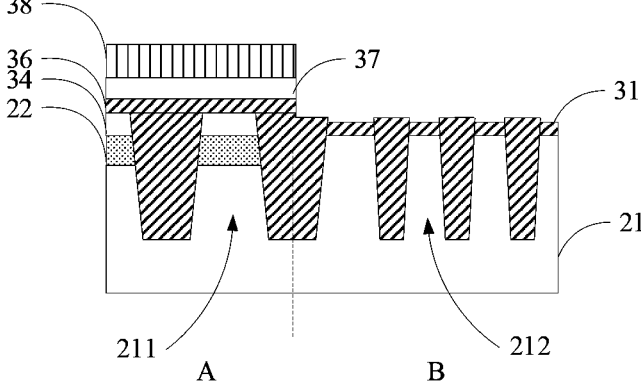
FIG. 14 is a sixth structural diagram illustrating the fabrication process in S43 of FIG. 4.

As shown in FIG. 14, the second well region B is thinned to expose the first sacrificial layer 31.

Specifically, a sixth sacrificial layer 36, a seventh sacrificial layer 37 and a eighth sacrificial layer 38 are formed sequentially in the first well region A, wherein the sixth sacrificial layer 36, the seventh sacrificial layer 37 and the eighth sacrificial layer 38 may be the same with the first sacrificial layer 31, the second sacrificial layer 32 and the third sacrificial layer 33, i.e. the sixth sacrificial layer 36 and the seventh sacrificial layer 37 may be formed in both the first well region A and the second well region B, while the eighth sacrificial layer 38 may be photoresist formed to correspond to the first well region A using a mask.

Figure 15:
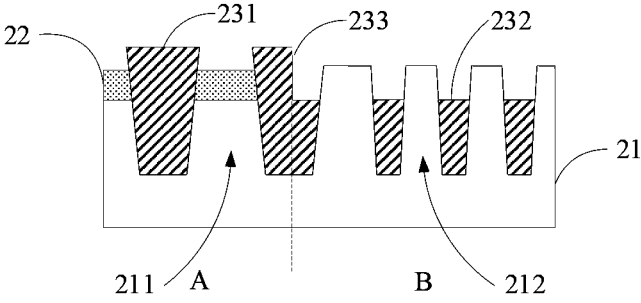
FIG. 15 is a seventh structural diagram illustrating the fabrication process in S43 of FIG. 4.

As shown in FIG. 15, the first well region A and the second well region B are thinned to expose the first gate oxide layer 22 and make the thickness of the second isolation structure 232 less than that of the second fin 212. Specifically, the first well region A and the second well region B are thinned to make the sum of the thicknesses of the first fin 211 and the first gate oxide layer 22 smaller than or equal the thickness of the second fin 212.

When thinning, for the first well region A, the fourth sacrificial layer 34 is removed to expose or further thin the first gate oxide layer 22. For the second well region B, the fourth sacrificial layer 34 is removed or the first sacrificial layer 31 is further removed completely or partially. Optionally, in one example, the first sacrificial layer 31 is removed completely so as to expose a portion of the second fin 212 in the second well region B.

S44: a second gate oxide layer is formed on the second fins, wherein the sum of the thicknesses of the first fin and the first gate oxide layer is less than or equal to the sum of the thicknesses of the second fin and the second gate oxide layer.

Figure 16:
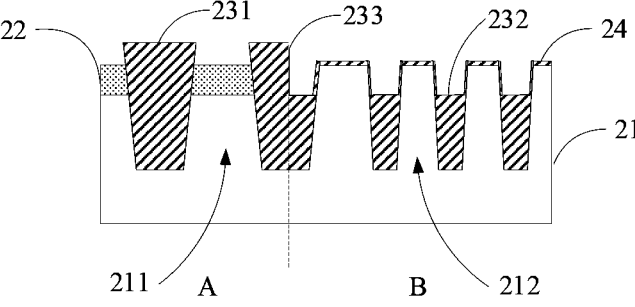
FIG. 16 is a structural diagram illustrating the fabrication process in S44 of FIG. 4.

As shown in FIG. 16, a second gate oxide layer 24 is formed on the second fin 212, wherein the sum of the thicknesses of the first fin 211 and the first gate oxide layer 22 is smaller than or equal to that of the second fin 212 and the second gate oxide layer 24.

It can be understood that the second fin 212 and the corresponding second gate oxide layer 24 are used to fabricate the fin-FETs subsequently. since the fin-FETs can solve the problem of short channel effect caused by further size reduction of planar FETs, both planar transistors and fin-FETs are formed in the semiconductor structure to form peripheral circuits, so that the integration degree of peripheral circuits in the 3D memory is increased and the area occupied by the integration is reduced.

S45: a gate layer is formed on the first gate oxide layer and the second gate oxide layer.

As shown in FIG. 3, a gate layer 25 is formed on the first gate oxide layer 22 and the second gate oxide layer 24.

S46: the gate layer is planarized.

It can be understood that FIG. 3 shows a structure of an example, in which the sum of the thicknesses of the first fin 211 and the first gate oxide layer 22 is equal to the sum of the thicknesses of the second fin 212 and the second gate oxide layer 24.

Figure 17:
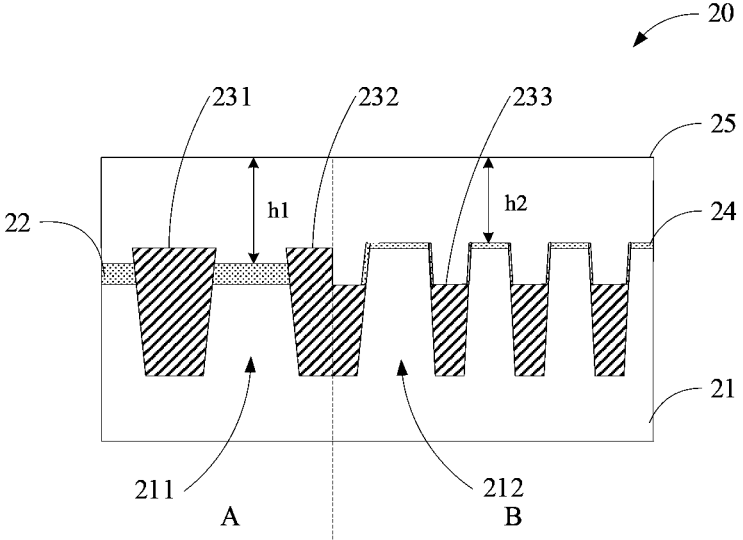
FIG. 17 is a structural diagram of another example of the semiconductor device provided by the present application.

Refer further to FIG. 17, which shows a structure of another example, in which the sum of the thicknesses of the first fin 211 and the first gate oxide layer 22 is smaller than the sum of the thicknesses of the second fin 212 and the second gate oxide layer 24.

As for the example of FIG. 3, the thickness h1 of the gate layer 25 corresponding to the first well region A is equal to the thickness h2 of the gate layer 25 corresponding to the second well region B, while, as for the example of FIG. 17, the thickness h1 of the gate layer 25 corresponding to the first well region A is larger than the thickness h2 of the gate layer 25 corresponding to the second well region B. Therefore, in the semiconductor device 20 obtained by the present example, the thickness h1 of the gate layer 25 corresponding to the high voltage well region is larger than or equal to the thickness h2 of the gate layer 25 corresponding to the low voltage well region. In the way described above, the size of window for the mask used in etching the gate layer is enlarged, so that the difficulty of the etching process is reduced and the yield and performance of the product is further improved. Further, in the way described above, no additional mask is needed in the etching process of the gate layer, reducing the etching cost. Examples of the present application provides examples of a semiconductor device, a fabrication method thereof, a 3D memory and a memory device, which can reduce difficulty of etching processes and improve yield and performance of products.

The present application provides examples of a semiconductor device that includes: a substrate including first fins and second fins; a first gate oxide layer disposed on the first fins; a second gate oxide layer disposed on the second fins, wherein the sum of the thicknesses of the first fin and the first gate oxide layer is less than or equal to the sum of the thicknesses of the second fin and the second gate oxide layer; and a gate layer disposed on the first gate oxide layer and the second gate oxide layer.

In one example, the thickness of the first fin is less than that of the second fin.

In one example, the semiconductor device further includes: first isolation structures disposed between two adjacent first fins; second isolation structures disposed between two adjacent second fins; and a third isolation structure disposed between one of the first fins and one of the second fins adjacent to the one of the first fins.

In one example, the sum of the thicknesses of the first fin and the first gate oxide layer is less than the thickness of the first isolation structure.

In one example, the sum of the thicknesses of the first fin and the first gate oxide layer is equal to the thickness of the first isolation structure.

In one example, the thickness of the second isolation structure is less than the thickness of the second fin.

In one example, the second gate oxide layer is disposed on the side surface and top surface of the portion of the second fin protruding above the second isolation structure and is connected with the second isolation structure.

In one example, the thickness of the third isolation structure on the side proximate to the first isolation structure is equal to the thickness of the first isolation structure, while the thickness of the third isolation structure on the side proximate to the second isolation structure is equal to the thickness of the second isolation structure.

The present application further provides an example method of fabricating a semiconductor device, wherein the semiconductor device includes a first well region and a second well region and the method of fabricating the semiconductor device includes: forming a substrate having a thickness in the first well region less than a thickness in the second well region; forming a first gate oxide layer on the substrate in the first well region; processing the substrate and the first gate oxide layer to form first fins on the substrate in the first well region and form second fins on the substrate in the second well region; forming a second gate oxide layer on the second fins, wherein the sum of thicknesses of the first fin and the first gate oxide layer is less than or equal to the sum of the thicknesses of the second fin and the second gate oxide layer; forming a gate layer on the first gate oxide layer and the second gate oxide layer; and planarizing the gate layer.

In one example, forming the substrate includes: providing a substrate; forming a first sacrificial layer on the substrate in the first well region and the second well region; forming a second sacrificial layer on the first sacrificial layer in the first well region and the second well region; forming a third sacrificial layer on the second sacrificial layer in the second well region; and thinning the first well region to remove the first sacrificial layer and the second sacrificial layer in the first well region and further to make the thickness of the substrate in the first well region less than the thickness of the substrate in the second well region.

In one example, processing the substrate and the first gate oxide layer to form the first fins on the substrate in the first well region and form the second fins on the substrate in the second well region includes: removing the second sacrificial layer; forming a fourth sacrificial layer on the first gate oxide layer in the first well region and on the first sacrificial layer in the second well region; forming a fifth sacrificial layer on the fourth sacrificial layer in the first well region and the second well region; forming first trenches on the substrate in the first well region, second trenches on the substrate in the second well region, and a third trench on the substrate at the boundary between the first well region and the second well region, so that the first fins and the second fins are formed on the substrate; and forming first isolation structures in the first trenches, forming second isolation structures in the second trenches and forming a third isolation structure in the third trench.

In one example, before forming the second gate oxide layer on the second fins, the method further includes: thinning the first well region and the second well region to expose the fourth sacrificial layer; thinning the second well region to expose the first sacrificial layer; and thinning the first well region and the second well region to expose the first gate oxide layer and make the thickness of the second isolation structure less than the thickness of the second fin.

In one example, thinning the first well region and the second well region to expose the first gate oxide layer includes: thinning the first well region and the second well region to make the sum of the thicknesses of the first fin and the first gate oxide layer less than or equal to the thickness of the second fin.

The present application further provides examples of a 3D memory that includes a memory array and a semiconductor device connected with the memory array, the semiconductor device being the semiconductor device described above.

The present application further provides a memory device including a memory and a controller, the memory being the 3D memory described above.

The semiconductor device provided by the examples of the present application includes: a substrate including first fins and second fins; a first gate oxide layer disposed on the first fins; a second gate oxide layer disposed on the second fins, wherein the sum of the thicknesses of the first fin and the first gate oxide layer is less than or equal to the sum of the thicknesses of the second fin and the second gate oxide layer; and a gate layer disposed on the first gate oxide layer and the second gate oxide layer. In the way described above, the thickness of the gate layer corresponding to a high voltage well region is larger than or equal to the thickness of the gate layer of a low voltage well region, which can enlarge the size of the window for the mask used in etching of the gate layer, reduce difficulty of the etching process and improve yield and performance of products. Further, in the way described above, no additional mask is needed in the etching process of the gate layer, reducing the etching cost.

Examples of the present application have been described above in detail and the principle and implementations of the present application are set forth using specific examples, however illustration of the examples above is only used to facilitate understanding of the method and core concept of the present application. Meanwhile, in light of the concept of the present application, those skilled in the art can make changes to the specific implementations and the range of application. In conclusion, the content of specification should not be understood to limit the scope of the present application.

The invention claimed is:

1. A semiconductor device, comprising:
   a substrate comprising first fins and second fins;
   a first isolation structure disposed between an adjacent two of the first fins;
   a first gate oxide layer disposed on the first fins, wherein a sum of a thickness of a first fin of the first fins and a thickness of the first gate oxide layer is less than or equal to a thickness of the first isolation structure;
   a second gate oxide layer disposed on the second fins, wherein the sum of the thickness of the first fin and the thickness of the first gate oxide layer is less than or equal to a sum of a thickness of a second fin of the second fins and a thickness of the second gate oxide layer; and
   a gate layer disposed on the first gate oxide layer and the second gate oxide layer.

2. The semiconductor device of claim 1, wherein the thickness of the first fin is less than the thickness of second fin.

3. The semiconductor device of claim 1, further comprising:
   second isolation structures disposed between adjacent two of the second fins; and
   a third isolation structure disposed between the first fin and the second fin adjacent to the first fin.

4. The semiconductor device of claim 3, wherein a thickness of a second isolation structure of the second isolation structures is less than the thickness of the second fin.

5. The semiconductor device of claim 4, wherein the second gate oxide layer is disposed on a side surface and a top surface of a portion of the second fin protruding above the second isolation structure and is connected with the second isolation structure.

6. The semiconductor device of claim 3, wherein a thickness of the third isolation structure on a side proximate to the first isolation structure is equal to a thickness of the first isolation structure, and wherein a thickness of the third isolation structure on a side proximate to a second isolation structure of the second isolation structures is equal to the thickness of the second isolation structure.

7. The semiconductor device of claim 1, wherein the first gate oxide layer and the second gate oxide layer are comprised of dielectric materials.

8. The semiconductor device of claim 1, wherein the gate layer includes gates of at least one of a field effect transistor or a planar transistor in the semiconductor device.

9. The semiconductor device of claim 1, further including a first well region and a second well region, wherein threshold voltages of devices in the first well region are higher than threshold voltages of devices in the second well region.

10. The semiconductor device of claim 1, wherein the thickness of the first fin is measured from a bottom surface of the substrate to a top surface of the first fin, and the thickness of the second fin is measured from the bottom surface of the substrate to a top surface of the second fin.

11. A method of fabricating a semiconductor device, wherein the semiconductor device comprises a first well region and a second well region, and the method of fabricating the semiconductor device comprises:

providing a substrate;

forming the substrate having a thickness in the first well region being less than a thickness in the second well region, wherein forming the substrate further comprises:

forming a first sacrificial layer on the substrate in the first well region and the second well region;

forming a second sacrificial layer on the first sacrificial layer in the first well region and the second well region;

forming a third sacrificial layer on the second sacrificial layer in the second well region; and thinning the first well region to remove the first sacrificial layer and the second sacrificial layer in the first well region and to make the thickness of the substrate in the first well region less than the thickness of the substrate in the second well region;

forming a first gate oxide layer on the substrate in the first well region;

processing the substrate and the first gate oxide layer to form first fins on the substrate in the first well region and form second fins on the substrate in the second well region;

forming a second gate oxide layer on the second fins, wherein a sum of a thickness of a first fin of the first fins and a thickness of the first gate oxide layer is less than or equal to a sum of a thickness of a second fin of the second fins and a thickness of the second gate oxide layer;

forming a gate layer on the first gate oxide layer and the second gate oxide layer; and planarizing the gate layer.

12. The method of fabricating the semiconductor device of claim 11, wherein processing the substrate and the first gate oxide layer to form the first fins on the substrate in the first well region and form the second fins on the substrate in the second well region comprises:

removing the second sacrificial layer;

forming a fourth sacrificial layer on the first gate oxide layer in the first well region and on the first sacrificial layer in the second well region;

forming a fifth sacrificial layer on the fourth sacrificial layer in the first well region and the second well region;

forming first trenches on the substrate in the first well region, forming second trenches on the substrate in the second well region, and forming a third trench on the substrate at a boundary between the first well region and the second well region, wherein the first fins and the second fins are formed on the substrate; and forming first isolation structures in the first trenches, forming second isolation structures in the second trenches, and forming a third isolation structure in the third trench.

13. The method of fabricating the semiconductor device of claim 12, wherein before forming the second gate oxide layer on the second fins, the method further comprises:

thinning the first well region and the second well region to expose the fourth sacrificial layer;

thinning the second well region to expose the first sacrificial layer; and thinning the first well region and the second well region to expose the first gate oxide layer and make a thickness of a second isolation structure of the second isolation structures less than the thickness of the second fin.

14. The method of fabricating the semiconductor device of claim 13, characterized in that thinning the first well region and the second well region to expose the first gate oxide layer comprises thinning the first well region and the second well region to make the sum of the thickness of the first fin and the thickness of the first gate oxide layer less than or equal to the thickness of the second fin.

15. A storage system, comprising:

a memory including:

a substrate comprising first fins and second fins;

a first isolation structure disposed between an adjacent two of the first fins;

a first gate oxide layer disposed on the first fins, wherein a sum of a thickness of a first fin of the first fins and a thickness of the first gate oxide layer is less than or equal to a thickness of the first isolation structure;

a second gate oxide layer disposed on the second fins, wherein the sum of the thickness of the first fin and the thickness of the first gate oxide layer is less than or equal to a sum of a thickness of a second fin of the second fins and a thickness of the second gate oxide layer; and a gate layer disposed on the first gate oxide layer and the second gate oxide layer; and a controller coupled to the memory.

16. The storage system of claim 15, wherein the thickness of the first fin is less than the thickness of the second fin.

17. The storage system of claim 15, further comprising:

second isolation structures disposed between adjacent two of the second fins; and a third isolation structure disposed between the first fin and the second fin adjacent to the first fin.

18. The storage system of claim 17, wherein a thickness of a second isolation structure of the second isolation structures is less than the thickness of the second fin.

19. The storage system of claim 18, wherein the second gate oxide layer is disposed on a side surface and a top surface of a portion of the second fin protruding above the second isolation structure and is connected with the second isolation structure.

20. The storage system of claim 17, wherein a thickness of the third isolation structure on a side proximate to the first isolation structure is equal to a thickness of the first isolation structure, and wherein a thickness of the third isolation structure on a side proximate to a second isolation structure of the second isolation structures is equal to the thickness of the second isolation structure.

* * * * *